(12) United States Patent
Castagna et al.

(10) Patent No.: US 6,928,603 B1
(45) Date of Patent: Aug. 9, 2005

(54) SYSTEM AND METHOD FOR INTERFERENCE MITIGATION USING ADAPTIVE FORWARD ERROR CORRECTION IN A WIRELESS RF DATA TRANSMISSION SYSTEM

(75) Inventors: Pete Castagna, Seattle, WA (US); Dave Randall, Kingston, WA (US)

(73) Assignee: Adaptix, Inc., Seattle, WA (US)

( * ) Notice: Subject to any disclaimer, the term of this patent is extended or adjusted under 35 U.S.C. 154(b) by 544 days.

(21) Appl. No.: 09/909,143

(22) Filed: Jul. 19, 2001

(51) Int. Cl.[7] .............................................. H03M 13/03

(52) U.S. Cl. .................................................... 714/786

(58) Field of Search ............................... 714/704, 708, 714/750, 751, 752, 746, 786, 799; 375/222, 375/224, 229; 341/50

(56) References Cited

U.S. PATENT DOCUMENTS

| | | | |
|---|---|---|---|
| 5,490,168 A * | 2/1996 | Phillips et al. ............... | 375/224 |
| 5,699,365 A * | 12/1997 | Klayman et al. ........... | 714/708 |
| 6,477,669 B1 * | 11/2002 | Agarwal et al. ............ | 714/708 |
| 2004/0015765 A1 * | 1/2004 | Cooper et al. .............. | 714/750 |

OTHER PUBLICATIONS

Cho et al., An adaptive FEC with QoS provisioning for Real-Time Traffic in LEO Satellite networks, Jun. 2001, IEEE, p. 2938-2942.*

Park et al., An adaptive FEC protocol for end-to-end transport of real-time traffic, 1998, IEEE, p. 196-205.*

* cited by examiner

*Primary Examiner*—Shelly A Chase
(74) *Attorney, Agent, or Firm*—Fulbright & Jaworski LLP

(57) ABSTRACT

An adaptive forward error correction system for mitigating interference and fading in RF data transmissions has a hub and subscriber stations transmitting and receiving forward error correction encoded data packets. The hub and subscriber stations count codewords and/or packets received with errors. The hub calculates a type of quality measure using the counts and compares this measure to quality thresholds. If an upper threshold is exceeded, the hub increases a size of transmitted active data fields and decreases a size of blank data fields. If a lower threshold is not met, the hub decreases a size of transmitted active data fields and increases a size of blank data fields. Similar changes by subscriber stations are directed by the hub. These changes are coordinated in headers associated with the packets or codewords, via a separate control channel or multi cast via a data stream used for transmitting the data packets.

51 Claims, 5 Drawing Sheets

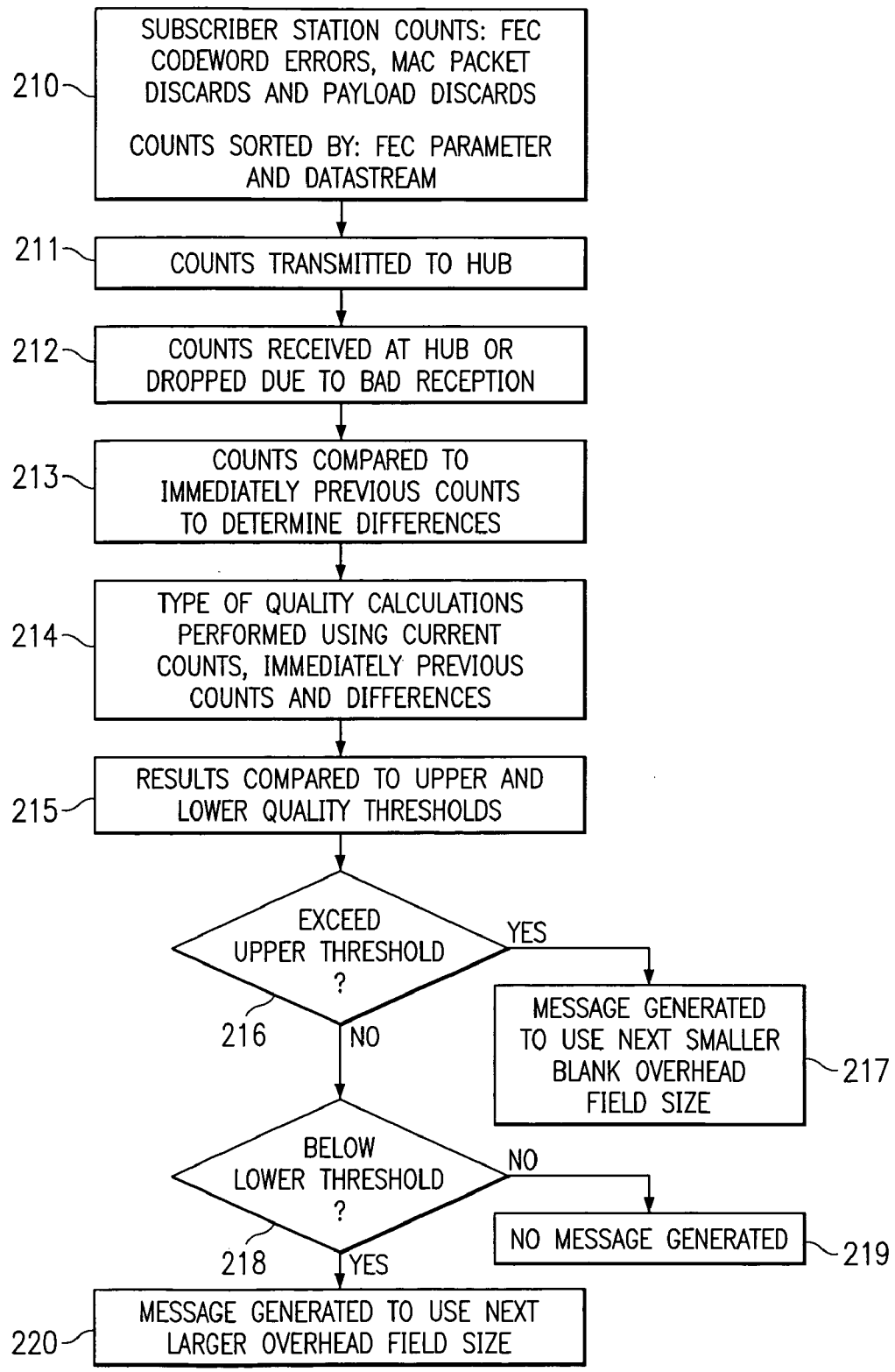

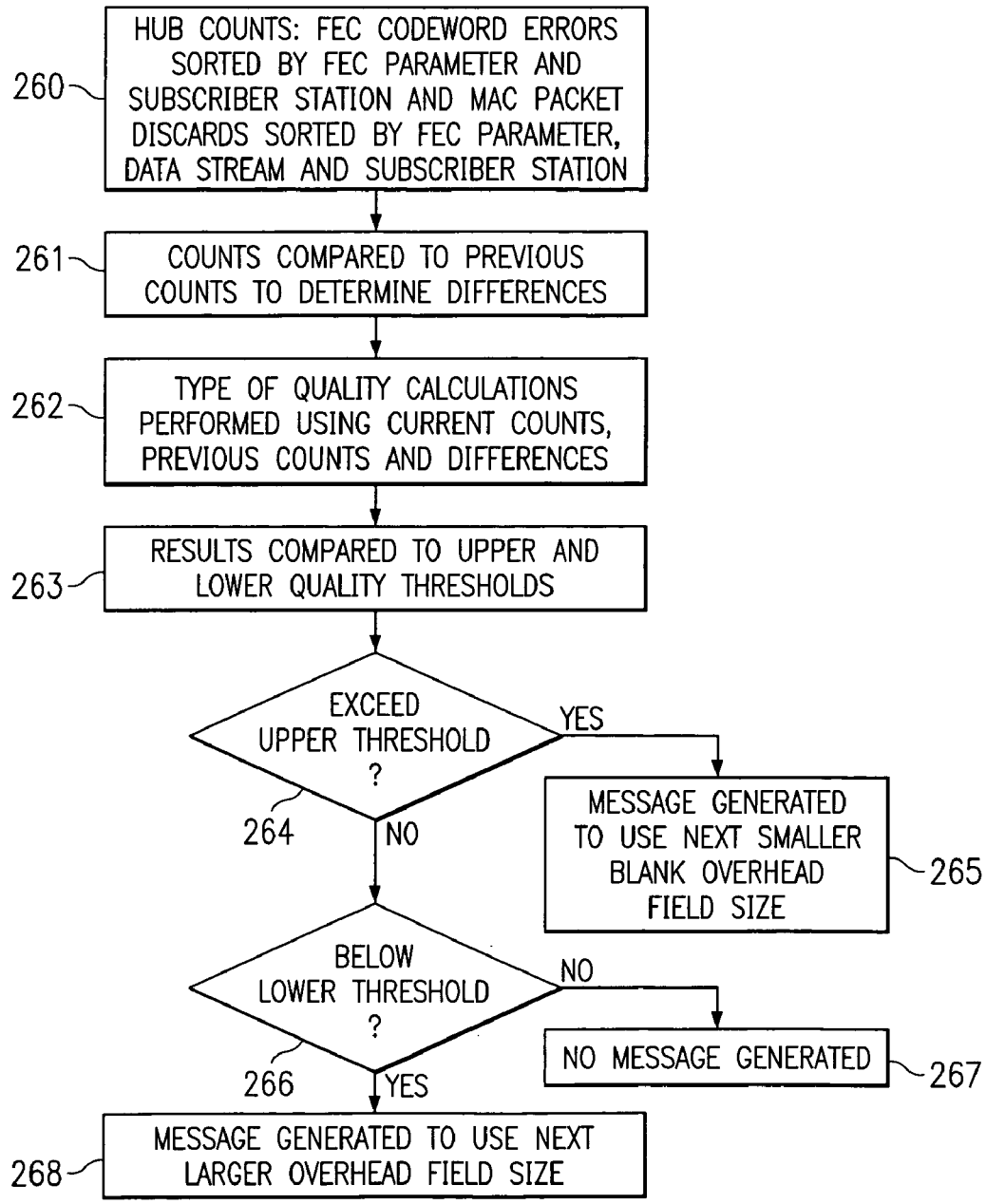

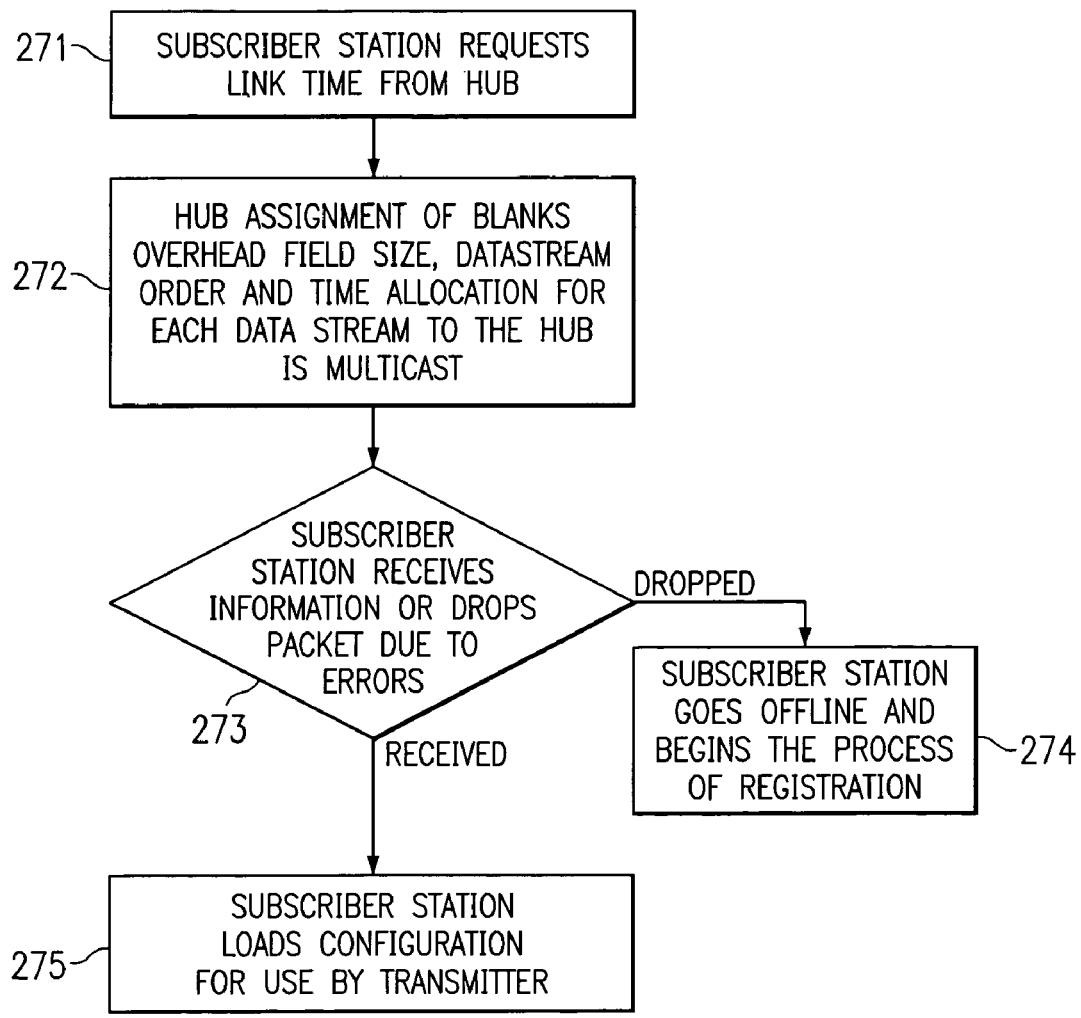

SYSTEM AND METHOD FOR INTERFERENCE MITIGATION USING ADAPTIVE FORWARD ERROR CORRECTION IN A WIRELESS RF DATA TRANSMISSION SYSTEM

TECHNICAL FIELD OF THE INVENTION

The present invention generally relates to digital communication systems and interference mitigation, and specifically relates to the use of methods of adaptive forward error correction (FEC) encoding and decoding in a wireless RF data transmission system.

BACKGROUND OF THE INVENTION

A multitude of data transmission systems currently called "last mile" or "last foot" are designed to provide high-capacity data access service directly to and from end-user premises. A number of these data transmission systems use RF transmissions. Some of these systems, called "point-to-point", exclusively connect a single end-user to a service provider, the Internet backbone or the like. Others of these systems, called "point-to-multipoint", are shared by a number of end-users for such a connection.

A fundamental characteristic of many existing systems, both point-to-point and point-to-multipoint, is that their RF transmissions are protected and regulated by a government body. A fundamental problem with protected, regulated RF transmission systems is that only a few such systems can operate in any given geographic area due to the limited RF frequency spectrum allocated to data access services.

Other unprotected but regulated RF frequency spectrums are allocated to data access services or to multiple shared services. When a high-capacity data access service provider is unable to provide service in a given geographic area because protected, regulated RF frequency spectrum is unavailable, it is desirable to use unprotected, regulated RF bands to be able to provide high-capacity data access service.

The Federal Communications Commission created one such unprotected, regulated RF frequency spectrum allocation in 1997. The Unlicensed National Information Infrastructure (U-NII) includes three frequency ranges of 5.15–5.25 GHz, 5.25–5.35 GHz and 5.725–5.825 GHz in which a multitude of data access service providers and others may operate systems in an unprotected, competitive fashion across the United States. The U-NII frequency spectrum is regulated according to FCC Rules, Part 15.

Since creation of the U-NII a number of standards for equipment operating in the U-NII frequency spectrum allocation have been defined and equipment has been built which uses the U-NII frequency spectrum allocation. One standard, by the IEEE standards group, designated IEEE 802.11a, specifies the operational parameters of equipment and systems using the 5.15–5.25 GHz and 5.25–5.35 GHz U-NII spectrum allocations for RF transmissions of high-capacity data access service. A standard by the European ETSI BRAN has defined the operation of equipment and systems in the U-NII spectrum.

Interference between the multiplicity of RF transmissions using the U-NII spectrum allocations at the same time in a given geographic area causes degradation in the quality of high-capacity data access in that area. Many techniques can be used to mitigate the degradation and restore the quality of the high-capacity data access to some degree. For example, the aforementioned standards employ interference mitigation techniques.

Well known techniques variously called, error correction encoding or forward error correction (FEC) reduce the information passing through a data transmission system to a point somewhere below the maximum information-carrying capacity of the data transmission system for error-free corrected data transmission in the presence of interference.

For FEC in a prior art point-to-point system, the information content need only be reduced for two connections, to and from the single end-user. In a point-to-multipoint system each end-user in the system has two connections to be considered. The downstream connections to the end-users come from shared central equipment. When the information content reduction of the downstream signal does not vary from user to user and too little information content reduction is performed, the number of end-users who can establish a useable connection will be reduced. However, if too much information content reduction is performed, the data rate for end-users who require little information content reduction will be slower than optimal, and the average data rate of the downstream signals will be reduced below optimal. Therefore, it is desirable to provide the highest error-free downstream data transmission capacity and the maximum subscriber coverage by varying information content reduction for each end-user in an RF wireless data transmission system.

Typical prior art high-capacity data access systems using RF transmissions in the unprotected, regulated frequency bands might provide multiple downstream connections, to the same location, each with a different fixed interference mitigation technique. An end-user connects to the highest-rate downstream it can reliably use. As long as the requirements for each end-user are within the capacity of the selected downstream this approach allows the maximum number of subscribers to be connected. However, each subscriber is forced to use only the limited capacity available through the available bandwidth slices.

Alternatively, a prior art high-capacity data access provider using RF transmissions in the unprotected, regulated frequency bands might provide a single downstream connection with interruptions in the downstream signal during which drastic changes of the downstream FEC parameters and modulation occur. These interruptions cause unusable time during which messages cannot be sent, but higher efficiency of transmission results during all other times.

Also, in point-to-multipoint systems using unprotected, regulated RF spectrum it is likely that interference will vary greatly and suddenly over time. Hence, an interference mitigation system which results in end-user coverage normally considered adequate may suddenly result in reduced end-user coverage.

Therefore, it is desirable to provide a downstream RF transmission technique for high-capacity data access, which will provide varying information content reduction on an end-user-by-end-user basis. Such a desirable system will allow connection by the maximum number of end-users and will not cause reduction of the capacity available to an end-user by making parts of the spectrum unavailable to that end-user. The desirable system will allow any single end-user to use as much of the available spectrum as the capacity of his information content reduction allows during a time that he is scheduled to receive data. Such a desired system should allow equipment at the end-user premises to operate in a superior fashion with respect to interference mitigation when compared to prior art wireless RF data transmission systems operating in the unprotected, regulated frequency bands. Also, such a system should minimize the loss of service availability during interference events.

BRIEF SUMMARY OF THE INVENTION

The present invention is directed to a system and method of varying forward error correction (FEC) parameters on an RF data link which connects from one data transmission station such as a hub station transmitter to a number of other data transmission stations such as subscriber station receivers. This variation of FEC parameters improves the availability and capacity of an RF data link as compared to the same RF data link with fixed FEC parameters. A link being a connection between hub station and one or a plurality of subscriber stations, or being a connection between one or a plurality of subscriber stations and a hub station. A link may also be a connection between a hub station and one or a plurality of subscriber stations over any media, such as a wireline or a point to point RF link. The FEC parameters adjusted set the mixture of overhead and data on the RF data link. The FEC parameters are adjusted in response to interference and signal strength changes present at the subscriber station receiver.

The RF data transmission system incorporating this method subdivides the RF data link into discrete time intervals. Between time intervals several values may be adjusted. A hub transmitter station connection to a single or plurality of subscriber receiver stations may be moved from one time interval to another to insure quality of data transmission to the subscriber station receiver(s). The length of the time intervals may be changed at the subscriber station receiver. Information about the time intervals and FEC parameter values may be communicated as an extension of the communication structure between the hub station transmitter and the subscriber station receiver. Subscriber station equipment that conforms to the foregoing system can be connected to a non-conforming hub. However, its function would be reduced to that of a prior art subscriber station.

Preferably, the subscriber station equipment maintains a database of statistics describing the value of an applicable measure of quality of each of the connections from hub stations to the subscriber station. The subscriber station equipment sends this database of statistics to the hub stations when solicited. A hub station finds the worst-case measure of quality for a particular connection, when necessary gathering statistics from a plurality of subscriber stations that share a particular connection, such as connections for multicast groups attached to a plurality of subscriber stations.

The hub station compares this worst-case measure of quality for a connection to the corresponding measure of quality for each of the time intervals. Then the hub schedules RF link transmissions from the hub station to the subscriber station(s) on a connection only during time intervals when adequate measure of quality or better is expected. The hub then reduces the length of the time interval previously used by that connection. The length of the time interval now used by that connection is increased as allowed by the measure of quality. When a time interval becomes unnecessary, because no connections are scheduled to occur during it, that time interval duration is set to zero. Thusly, time intervals grow and shrink based on the amount of data scheduled to be sent for each time interval, and based on a priority of service for the data.

The present system for adaptive FEC forces some input symbols to the FEC decoder to known values before decoding. During any of the aforementioned time intervals a prearranged set of data bytes in each FEC encoded block is filled with known, non random values. At the receiver, these bytes are automatically overwritten with the known values before decoding of the block. At the output of the decoder the known values are deleted before the decoded block is delivered to the end-user's equipment.

Base block encoding of the preferred embodiment matches a prior art FEC encoding scheme employed by prior art hub transmitter units, such as Read-Solomon (RS) codewords. Therefore, the subscriber stations in the preferred system embodiment will operate with a hub transmitter unit whether or not the hub is employing the present invention.

For systematic fixed-size block codes, with fixed block size N+P symbols, where N symbols of each codeword map exactly to the N payload symbols, and P overhead symbols of each codeword contain the calculated code parity symbols, a fixed subset M of the N symbols in the transmit payload are replaced by known values in the present invention. FEC decoding at the subscriber station proceeds after the fixed subset M of symbols in the received codeword is replaced by known values. However, a codeword error is signaled if the decoding indicates an error in one of the known M symbols.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 2A is a flow chart diagram of a preferred embodiment of the present method for a downlink;

FIG. 2B is a flow chart diagram of a preferred embodiment of the present method for an uplink;

FIG. 2C is a flow chart diagram of a preferred embodiment of the present method for allocating time intervals in the up link to various FEC parameters;

DETAILED DESCRIPTION OF THE INVENTION

Figure 1:
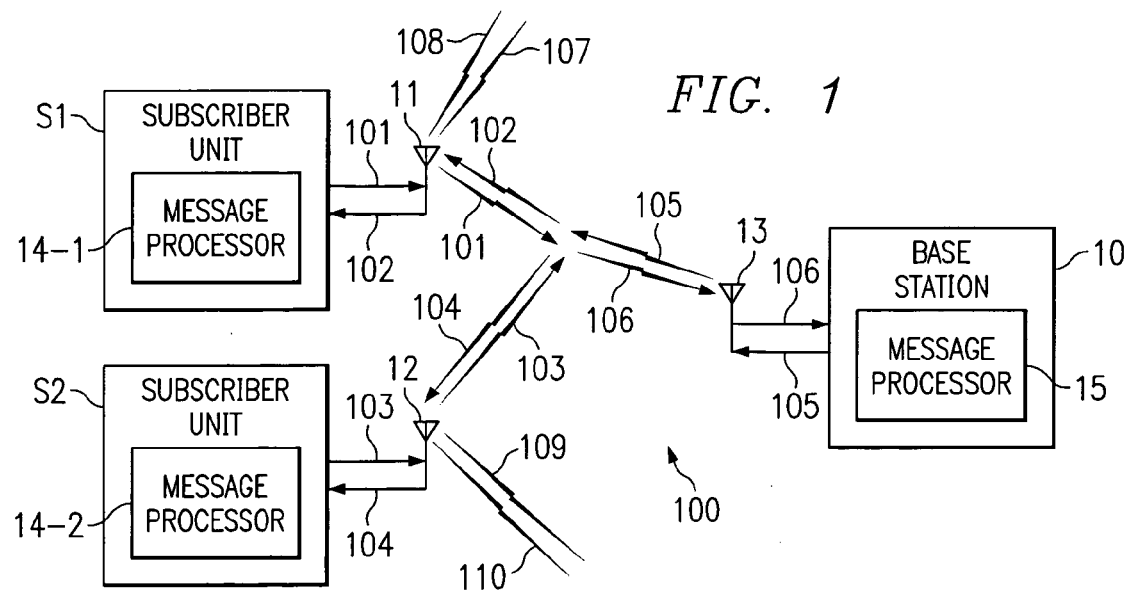
FIG. 1 is a diagrammatic representation of an RF data transmission system which may employ the present adaptive forward error correction system.

Turning now to FIG. 1, there is shown system 100, which includes a plurality of subscriber stations S1, S2 connected via antennas 11, 12 and 13 to hub base station 10 over an RF interface shown as signals 101, 102, 103, 104, 105 and 106. The system may experience interference such as from noise sources 107, 108, 109 and 110. Signals 102 and 104 are preferably different linearly filtered versions of signal 105. Noise sources 108 and 110 are added to signals 102 and 104 respectively. Similarly, signal 106 is the sum of linearly filtered signals 101 and 103 and noise sources 107 and 109. Included in the subscriber stations are message processors 14-1 and 14-2 respectively, and included in base station 10 is message processor 15. Preferably the hub base station and the subscriber stations exchange FEC encoded data adapted by the present invention.

The downstream FEC encoder is contained within the base station message processor 15, and a downstream FEC decoder is defined within each subscriber station message processor such as 14-1 or 14-2. The upstream FEC encoder is contained within the subscriber station message processors 14-1 and 14-2 for signals 101 and 103, respectively. The upstream FEC decoder for signals 101 and 103 is contained within the hub station message processor 15. The present method for adjusting FEC parameters inserts fixed overhead data herein referred to as "blanks" in the stream of data that enters an FEC decoder. Some time after a blank is inserted at the encoder input, a blank appears at the decoder output. It should be understood that blank encoder output data can be overwritten between the encoder and the decoder, as long as the correct blank is present at the right time at the decoder input. The FEC decoder input, with its corrected (prearranged in location) blanks is decoded into a stream of data containing blanks. A decor blank is discarded at the decoder output as it carries no usable information.

Preferably, the content of blank data is known beforehand by both the hub station and the subscriber station. For example, as long as the subscriber station encoder output and the hub station decoder input are synchronized, a blank will be received without data error. Accordingly, the more often a blank occurs in the stream of data that enters the decoder, the less often a data error occurs in the stream of data that exits the decoder.

Preferably, the present method for adjusting FEC parameters has a prearranged overhead for each value of the FEC parameters. The subscriber stations are informed of the values of the FEC parameters at all times. The subscriber stations preferably receive the values of the FEC parameters in a broadcast message that lists the values of the FEC parameters during each time interval between the broadcast message and the next FEC parameter broadcast message. Alternatively, these changes may be coordinated in headers associated with the packets or codewords; via a control channel separate from channels used for transmitting the data packets; or via a data stream contained in the channel user for transmitting the data packets.

For example, part 102 of signal 105 intended for use by subscriber station S1 is adjusted to have specific FEC parameters in response to messaging originating from subscriber station S1. Similarly, part 104 of signal 105 intended for use by subscriber station S2 is adjusted to have specific FEC parameters in response to messaging originating at subscriber station S2. A subscriber station may evaluate the quality of the data stream according to criterion prearranged with the base station. Preferably this criterion is a count of Reed-Solomon (RS) FEC decode failures, a count of convolutional decode failures, or any applicable quantity that can be detected by the subscriber station. The subscriber station regularly notifies the hub of the results of its evaluations, preferably embedding the information in signal 101 or 103, once per upstream burst. For a data stream that has more than one subscriber station as a destination the worse-case FEC interval is selected.

The hub station compares the subscriber station's evaluation of the data stream to a provisioned measure of quality prearranged with the subscriber. If the quality of the data stream is excessively good, and therefore the efficiency of the system correspondingly bad, the hub will allow the data stream to be sent during a time interval using more efficient FEC parameters. If the quality is excessively bad, and therefore the efficiency is excessively good, the hub will force the data stream to be sent during a time interval using less efficient FEC parameters. This adaptation continues, as detailed in FIG. 2A and described in detail below, until the provisioned quality of the data stream results for each subscriber station is obtained, or until limits of adjustment are reached.

For signal 106, as shown in FIG. 2B and described in detail below, the hub evaluates the quality of the data streams 101 and 103 according to some criterion, that can be evaluated within the hub station, preferably the aforementioned criteria. If the quality of the data stream is excessive or deficient, and therefore the efficiency is correspondingly deficient or excessive, the hub will require the corresponding subscriber station to use a different encoding scheme and will allocate the required, somewhat different time interval. After the base station has selected the downstream FEC parameter and time interval for each subscriber station, it calculates a new FEC parameter message based on maximizing the efficiency of the over-all data stream while maintaining the promised quality of the individual data streams.

Figure 3:
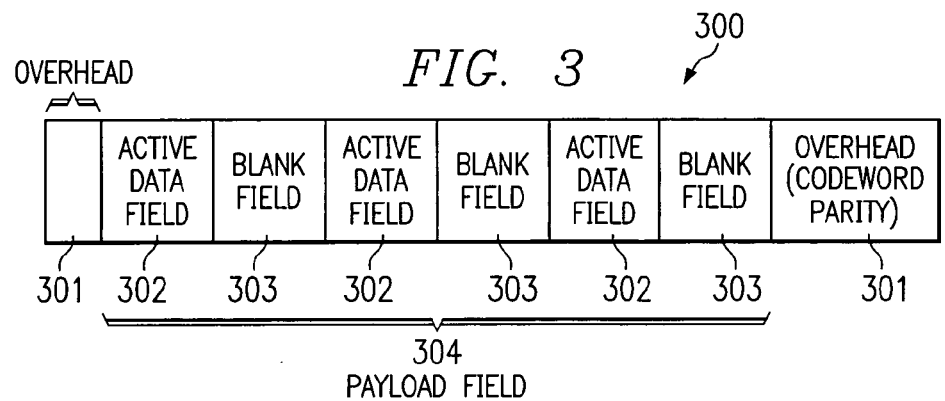
FIG. 3 is a block diagram of a preferred embodiment of a data transmission codeword of the present system and method.

FIG. 3 shows a preferred byte-wide RS codeword 300 with twenty parity bytes. Preferably, codeword 300 has been shortened to 252 bytes from its maximum 255 bytes. Codeword 300 is generally comprised of minimal overhead field 301; and payload field 304. Payload field 304 is generally comprised of active data field 302; and blank overhead field 303. The minimal overhead field 301 contains RS parity bytes for payload field 304. Preferably, the present system can correctly decode a codeword 300 with up to ten corrupted bytes. The lengths of active data field 302 and blank overhead field 303 are concurrently adjusted as necessary for effective error correction. Errors should not occur in blank overhead field 303 since the decoders already know the corrected values of this field. As a result, the present system can correctly decode a codeword 300 with up to ten corrupted bytes in the active data field 302. Codeword 300 is used in both the downstream and the upstream links by the present invention. As the byte error rate increases, the size of active data field 302 is preferably decreased until an acceptably small probability that ten corrupted bytes will occur is reached, based on the provisioned measure of quality for that codeword.

Signals 102 and 104 each preferably consist of multiple distinct time slices of the same physical channel. Alternatively, they may be transmissions on different physical channels, including on different frequencies or on different polarizations of the same frequency, occupying overlapping time slices. That is, an alternative signal 105 may not have a linearly filtered relationship to signals 102 and 104. Regardless, signals 104 and 102 preferably each have multiple distinct FEC parameters and generally have various active data field 302 and blank overhead field 303 lengths. Subscriber stations S1 and S2 are informed beforehand of the FEC parameters active at all times on signals 102 and 104 so that each subscriber station can properly decode the FEC encoding. Similarly subscriber stations S1 and S2 are informed beforehand of the FEC parameters to be used on signals 101 and 103 so that the hub station FEC decoder can properly decode each subscriber station encoding.

Figure 4:
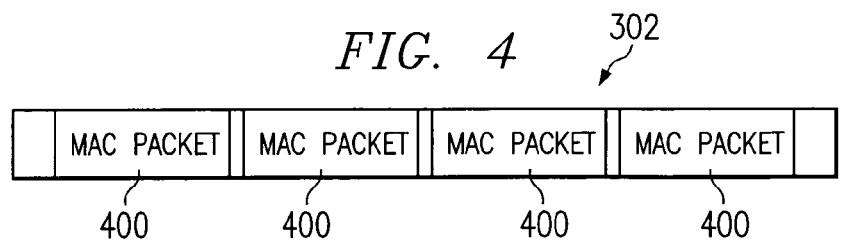
FIG. 4 is a block diagram of a preferred embodiment of a sequence of media access control packets making up the active data fields of FIG. 3 of the present system and method which become.
Figure 4A:
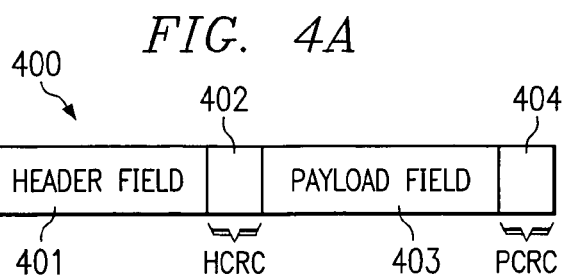
FIG. 4A is a block diagram of a single media access control packet of the present system and method.

As shown in FIG. 4, active data field 302 is generally comprised of a plurality of media access control (MAC) packets 400. FIG. 4A shows preferred MAC packet 400, comprised of MAC header field 401, MAC header cyclic redundancy check byte 402, payload field 403 and payload cyclic redundancy check byte 404. Preferably, MAC header field 401 contains a subfield identifying to which data stream between the hub and the subscriber station(s) the MAC packet belongs. MAC header cyclic redundancy check byte 402 is used to determine whether entire MAC packet 400 should be discarded due to address decode errors. Payload cyclic redundancy check byte 404 is used to determine whether payload 403 should be discarded due to errors. Payload 403 may be discarded even though the MAC header check byte 402 does not indicate packet 400 should be discarded; but if MAC packet 400 is discarded, payload 403 must be discarded.

A byte of active data field 302 is presented for decoding as a part of an RS codeword 300. In both the downstream and the upstream links the active data field 302 is distributed in a plurality of RS codewords. In the downstream link the active data field packet boundaries have no relationship to the RS codeword boundaries. In the upstream link the first active data field MAC packet for a specific subscriber station burst preferably begins on a an RS codeword boundary, although later MAC packets in that burst, which may contain pieces of multiple data streams, have no relationship to the RS codeword boundaries.

Figure 5:
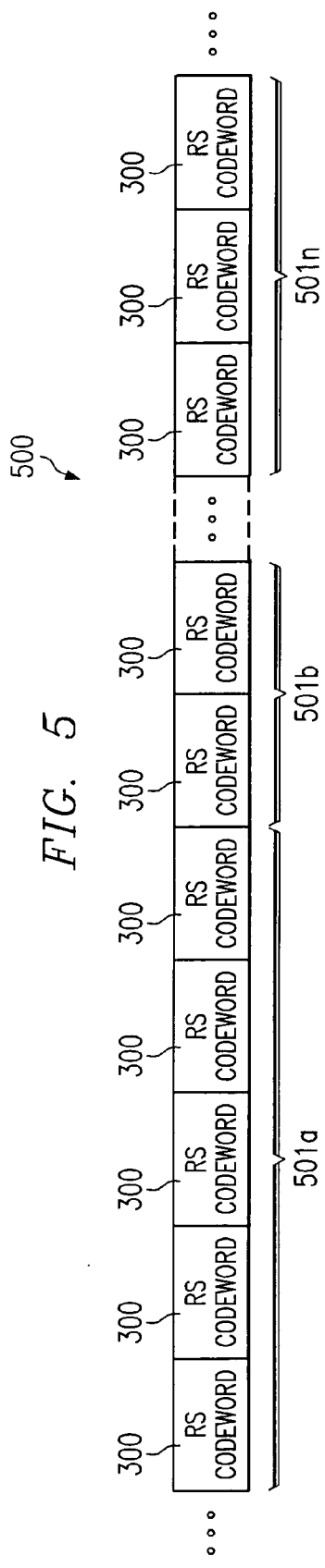
FIG. 5 is a block diagram of a downstream transmission divided into data transmission codewords of the present system and method.

FIG. 5 shows general detail of an example of the preferred downstream signal, such as signal 105. Preferably, the downstream signal is comprised of RS codewords 300 and is divided into time intervals 501a through 501n. During each time interval a specific FEC parameter has a particular value. During a particular time interval all data streams requiring that time interval's specific FEC parameter value are transmitted. However, if there is some unused time in an interval, data streams requiring less quality, and therefore a smaller overhead blank field 303, can also be sent during that time interval.

Figure 6:
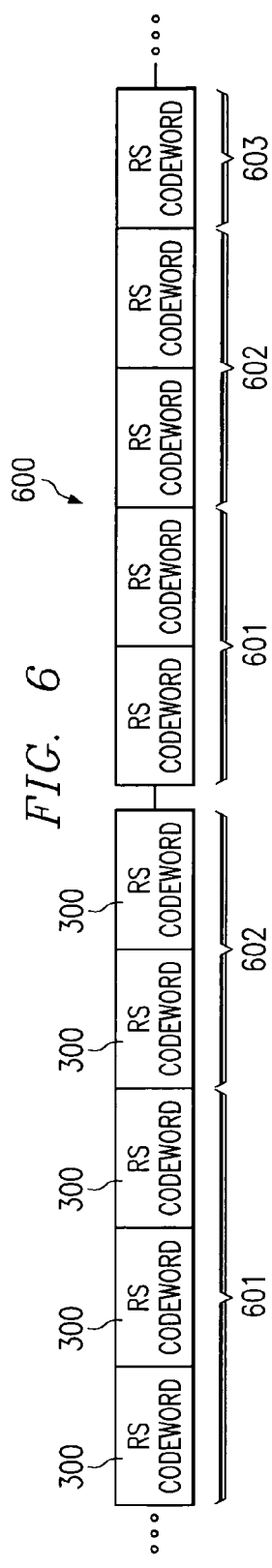
FIG. 6 is a block diagram of a burst upstream transmission divided into data transmission codewords of the present system and method, illustrating two bursts in sequence with an adaptation FEC change between bursts.

FIG. 6 shows general detail of an example of a preferred upstream signal 600, such as signal 106. The upstream signal may be the sum of linearly filtered versions of the upstream signals from multiple subscribers, such as illustrated signals 101 and 103. Part 601 of signal 106 coming from signal 101, and part 602 of signal 106 coming from signal 103, have been arranged to not overlap time intervals with each other or other parts 603 of signal 106. Each of the two signals 101 and 103 is divided into RS codewords 300, and each signal has its own specific FEC parameter values associated with it as were assigned by earlier messages from the base station. As noted above, each upstream signal begins on an RS codeword boundary.

Preferably, each channel up from or down to a specific subscriber station is handled independently. By way of example, the part of downlink 500 destined for subscriber station S1 carrying a high-quality data stream may have a maximum-sized blank overhead field 303 while the part of downlink 500 destined for subscriber station S2 and for low-quality data streams on S1 may have no blank overhead field 303 at all. At the same time, the part of uplink 600 from subscriber station S2 may have a maximum-sized blank overhead field 303 while the part of downlink 600 from subscriber station S1 may have no blank overhead field 303 at all. Returning to FIG. 1, the previous example might occur if, for example, noise source 108 interferes with downstream RF transmissions but only during transmissions 102, such as self-jamming caused by a multipath fade in signal 102, but noise source 108 does not interfere between the hub and S2; simultaneously noise source 109 interferes with upstream RF transmissions between S2 and the hub, but only during transmissions 103, but noise source 109 does not interfere between S1 and the hub. Thusly, the present system adapts the FEC of each signal to compensate for the signal quality of each signal, and does not adapt the entire system to meet a theoretical limit for the entire aggregate system.

Preferably, a specific MAC packet 400 is used to communicate a schedule of FEC parameter value changes to the subscriber stations from the hub, for both downstream and upstream data 500 and 600. An alternative method of informing subscriber stations S1 and S2 of the FEC parameter value of a RS codeword may be to designate a field in the RS codeword 300 as the FEC parameter value, or to designate a field in an RS codeword as the FEC parameter value for the next RS codeword. The latter removes the need for a resynchronization interval. Preferably, a sequence of fields in a sequence of codewords is required to confirm a new value before a change in the FEC parameter value is implemented. This reduces the probability of noise causing false detection of a change in FEC parameter values. However, such an FEC parameter value change when embedded in the basic RS codeword structure must be encrypted and authenticated to prevent falsification and thereby data flow disruption.

Preferably, as detailed below, subscriber stations S1 and S2 each analyzes the data it receives for data stream quality. To do so each subscriber station preferably maintains a count of FEC codeword errors, sorted by FEC parameter; a count of FEC codeword errors destined for the counting subscriber station, sorted by data stream and FEC parameter; a count of MAC packet 400 discards sorted by FEC parameter; and a count of payload 403 discards for packets destined for the counting subscriber station, sorted by data stream and FEC parameter. Periodically, the results of this analysis are communicated to processor 15 at the hub 10, preferably embedded as packets in the data streams 101 and 103. Alternatively, to facilitate faster response by the hub to change FEC parameters, the results may be sent as part of minimal overhead 301 or the blank overhead 303 fields of upstream RS codewords, with encryption and authentication requirement similar to these of the downstream.

The message processor 15 in hub 10, upon receiving the data stream quality information from a subscriber station, compares the data stream quality to provisioned thresholds and queues further data on that stream to be transmitted during a time interval with either a larger, the same, or a smaller blank overhead field 303 based upon the result of the comparison.

Turning now to FIG. 2A, downlink control process 200 according to a preferred embodiment of the present invention for setting the downlink blank overhead field size discussed earlier is flow-charted. At box 210 a subscriber station maintains a count of received data codewords and/or data packets with errors. Such counts can include: FEC codeword errors sorted by FEC parameter; FEC codeword errors destined for that subscriber station, sub-sorted by data stream and FEC parameter; MAC packet discards, sub-sorted by FEC parameter; and payload 403 discards for packets destined for that subscriber station, sub-sorted by data stream and FEC parameter. A MAC packet may straddle an FEC parameter change boundary. In that case, an error in the packet is sorted according to the final FEC parameter used.

Preferably, at box 211, as part of a scheduled upstream transmission, a packet is generated, queued and transmitted containing the counts generated in box 210. At box 212 the transmission of box 211 is received at the hub or is dropped due to bad reception. At box 213, as a result of good reception, the received counts are compared to previously received counts to find the difference. Preferably, the hub maintains the total number of FEC codewords sorted by FEC parameter, the total number of MAC Packets sorted by FEC interval, and the total payload for packets destined to each subscriber station, sorted by data stream, since the previous comparison at box 213. At box 214 this maintained information is retrieved and appended to the information received from the subscriber station. "Zero occurrence" cases are flagged as meaningless data. The hub appends information about the type of service for each data stream destined to the subject subscriber station in the form of definitions of type of quality measure calculations to be performed. Upper and lower thresholds for values resulting from these calculations are also appended.

At box 214, a number of prearranged calculations are performed. Any desired calculation that can be performed in the hub station using data available at the hub station can be designated as meaningful. Even calculations using authenticated external data can be designated meaningful. However, calculations involving zero occurrences are not considered meaningful. The codeword error rate can be calculated for each data stream handled by the subscriber station, sorted by FEC interval for which this calculation is meaningful. The type of service determines whether this rate is meaningful, since the type of service determines the quality measure. The codeword error rate can be calculated for the data streams, in aggregate, handled by the subscriber station, sorted by FEC interval, if that statistic is meaningful. The packet error rate can be calculated for each data stream, sorted by FEC interval, handled by the subscriber station, for which this calculation is meaningful. The packet error rate for the data streams, in aggregate, handled by the subscriber station, sorted by FEC interval, can be calculated, if that statistic is meaningful.

In box 215, the results of the meaningful calculations in 214 are compared to precalculated upper and lower thresholds of quality for data streams destined for the subject subscriber station. Preferably, meaningless data cases that have been flagged are not used in the comparison. At 216, when the upper threshold is exceeded, a message is generated at box 217 by the message-processing unit 15 that changes the FEC value associated with that data stream to use the next smaller available blank overhead field size value, down to the available. When the upper threshold of quality is not exceeded and the lower threshold of quality is met or exceeded at box 218, no message is generated, box 219. When the lower threshold of quality is not met at box 218, a message is generated at 220 by the message-processing unit 15 that changes the FEC value associated with that data stream to use the next larger available blank overhead field size value up to the maximum available.

A separate process carried out by message-processing unit 15 allocates time intervals in the downstream signal 500 to the various FEC parameter values. The minimum time for each data stream is reserved for an FEC parameter value. When more time is available than is reserved, time is reserved per FEC parameter value in proportion to past requirements for each data stream.

Alternatively, subscriber stations S1 and S2 each maintain timers which count the number of RS codewords, at the RS decoder input, since a predetermined past initialization point, time zero. The subscriber stations receiving downstream signals 102 and 104, which at the decoder level are combined as signal 105, each compare the counter value to an internal table of prearranged FEC parameter change counts to determine the FEC parameter value in use by signals 102 and 104.

Turning now to FIG. 2B, uplink control process 250 according to a preferred embodiment of the present invention for setting the uplink blank overhead field 303 size is flow-charted. At box 260 counts are maintained at the hub of received data codewords and/or data packets with errors. Such counts can include: upstream FEC codeword errors sorted by subscriber station; and upstream MAC packet discards for each data stream. As pointed out above, preferably, a MAC packet may straddle an FEC parameter change boundary. At box 261 the various counts are compared to previous counts to find the difference.

For upstream transmissions from a particular subscriber station, the hub preferably retains a count of: the total number of expected FEC codewords; the total number of expected MAC packets, and the total payload carried by packets on a subject data stream, sorted by FEC parameter. This information is appended to the count information at box 262, and the "zero occurrences" cases are flagged as leading to meaningless data. The hub recognizes the type of service required for each data stream, and appends this information at box 262 in the form of definitions of type of quality measure calculations to be performed and the upper and lower thresholds for values of the results of these calculations on a data stream by data stream basis.

A number of prearranged calculations are performed in box 262. Preferably, any desired calculation that can be performed in the hub station using data available at the hub station and which results in corrective feedback can be designated as meaningful. The codeword error rate can be calculated for each subscriber station, when this calculation is meaningful. The type of service determines whether this calculation is meaningful, since the type of service determines the calculation to be used, and the thresholds for whether the data stream quality is good enough to be billed. The codeword error rate for a data stream from one subscriber station can be calculated if that calculation is meaningful. The packet error rate can be calculated for each data stream, sorted by subscriber station, for which this calculation is meaningful. The packet error rate for the data streams in aggregate from one subscriber station can be calculated if this calculation is meaningful. The packet error rate for a single data stream from one subscriber station can be calculated if this calculation is meaningful.

In box 263 the results of the meaningful calculations in 262 are compared to precalculated upper and lower thresholds for the different data streams. Flagged meaningless data cases are not used. At 264, when the upper threshold is exceeded, a message is generated at box 265 to the message-processing unit 15 that changes the FEC value associated with that upstream data stream to use the next lower available blank overhead field size, down to the minimum available. When the upper threshold is not exceeded at 264 but the lower threshold is exceeded at 268, no message is generated, box 267. When the lower threshold is not met at 266, a message is generated at 268 to the message-processing unit 15 that changes the FEC value associated with that upstream data stream to use the next higher available blank overhead field size, up to the maximum available.

Turning to FIG. 2C, a separate process 270 of the message-processing unit 15 allocates time intervals in the upstream link to various FEC parameter values employed. In box 271, a subscriber station requests upstream time for each data stream it uses. Preferably, the hub has determined the blank overhead field size as detailed above for each data stream in the next upstream burst from a subscriber station. Then at 272 the hub determines the physical transmission order of the data streams and how much time is allocated to each data stream in a single transmission from a subscriber station to the hub station. The hub designates an FEC parameter for each FEC block contained in the upstream transmission.

In block 272, the various results of the latest upstream subscriber station time slot allocations, the sub-allocations for each upstream data stream, the data stream transmission order directions, and the FEC parameter value for every FEC block in the upstream transmission are collected. Preferably, this configuration information is sent as a single message to all of the subscriber stations. This packet is preferably transmitted during a time interval when the FEC parameter value is at its highest available blank overhead field value. The highest blank overhead value is always the same value. This allows all subscriber stations that can use the downstream link to synchronize to the link. This process repeats itself, preferably, once per upstream transmission burst per subscriber.

In block 273, a subscriber station receives the packet generated in 272, or drops it due to errors in reception. Preferably, when a configuration packet is dropped, the subscriber station goes off-line and reregisters, searching for a hub, at box 274. In block 275, when the configuration packet is received the subscriber station loads the set of directions embodied by the information for use by the subscriber station's upstream transmitter in the next upstream transmission.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An adaptive forward error correction method comprising the steps of:
    comparing a count of received data codewords and packets with errors uncorrectable by forward error correction to at least one predetermined threshold of quality;
    adjusting, in response to said comparing step, a size of active data fields of codewords comprised of data packets to one of a plurality of sizes;
    adjusting, in response to said comparing step, a size of blank data fields of said codewords comprised of data packets; and
    maintaining a sum of said sizes before and after said adjusting steps.

2. The method of claim 1 wherein said adjusting a size of active data fields comprises increasing a size of said active data fields and said adjusting a size of blank data fields comprises decreasing a size of blank data fields of said codewords comprised of data packets.

3. The method of claim 2 wherein said blank data fields are comprised of data having known values.

4. The method of claim 3 wherein said data comprising blank data fields is discarded by a forward error correction decoder after decoding each of said codewords.

5. The method of claim 1 wherein said adjusting a size of active data fields comprises decreasing a size of said active data fields and said adjusting a size of blank data fields comprises increasing a size of blank data fields of said codewords comprised of data packets.

6. The method of claim 5 wherein said blank data fields are comprised of data having known values.

7. The method of claim 6 wherein said data comprising blank data fields are discarded by a forward error correction decoder after decoding each of said codeword.

8. The method of claim 1 wherein said adjusting steps are carried out by a data communications hub.

9. The method of claim 1 further comprising the step of directing a data communications subscriber station to carry out said adjusting steps.

10. The method of claim 1 wherein said at least one threshold comprises an upper threshold of quality and in response to said upper threshold of quality being exceeded, said adjusting a size of active data fields comprises increasing a size of said active data fields and said adjusting a size of blank data fields comprises decreasing a size of blank data fields of said codewords comprised of data packets.

11. The method of claim 1 wherein said at least one threshold comprises a lower threshold of quality and in response to said lower threshold of quality not being met, said adjusting a size of active data fields comprises decreasing a size of said active data fields and said adjusting a size of blank data fields comprises increasing a size of blank data fields of said codewords comprised of data packets.

12. The method of claim 1 wherein said at least one threshold comprises at least an upper threshold of quality and a lower threshold of quality, said adjusting a size of active data fields comprises increasing a size of said active data fields and decreasing a size of blank data fields in response to said upper threshold of quality being exceeded and said adjusting a size of blank data fields comprises decreasing a size of said active data fields and increasing a size of said blank data fields in response to said lower threshold of quality not being met.

13. The method of claim 12 wherein said adjusting step further comprises the step of:
   maintaining a size of said active data fields and said blank data fields in response to said upper threshold of quality not being met and said lower threshold of quality being exceeded.

14. The method of claim 1 wherein said count of received data codewords and packets with errors is carried out by a data transmission subscriber station, and comprises a count of at least one of a group consisting of:
   codeword errors;
   codeword errors destined for said subscriber station;
   packet discards; and
   payload discards for packets destined for said subscriber station.

15. The method of claim 14 further comprising the step of:
   sorting said count according to data stream.

16. The method of claim 14 further comprising the steps of:
   maintaining a count by an RF data transmission hub of total number of codewords transmitted to said subscriber station, total number of packets sent to said subscriber station, and total data payload sent to said subscriber station, since a previous comparing step;
   sorting said count according to data stream; and
   transmitting to said hub said count of received data codewords and packets with errors from said subscriber station.

17. The method of claim 1 wherein said count of received data codewords and packets with errors is carried out by an RF data transmission hub station, and comprises a count of at least one of a group consisting of:
   codeword errors for each data stream received by said hub;
   aggregate codeword errors received by said hub;
   packet discards for each of said data streams; and
   aggregate packet discards by said hub.

18. The method of claim 17 further comprising the step of:
   sorting said count according to a subscriber station transmitting said data codewords and packets.

19. The method of claim 17 further comprising the step of:
   sorting said count according to data stream.

20. The method of claim 17 further comprising the steps of:
   retaining said count by said hub as a previous count; and
   continuing said count.

21. An adaptive forward error correction method comprising the steps of:
   counting received data codewords and packets with errors uncorrectable by forward error correction;
   evaluating the results of said counting step in light of previous counts of received data codewords and packets with errors uncorrectable by forward error correction to obtain a difference;
   calculating a type of quality measure using at least one of said results of said counting step, said previous counts and said difference;
   comparing the results of said calculating step to at least one predetermined threshold of quality; and
   adjusting, in response to said comparing step, a size of active data fields and a size of blank data fields of codewords, said codewords comprised of data packets.

22. The method of claim 21 wherein said at least one threshold comprises an upper threshold of quality and in response to said upper threshold of quality being exceeded said adjusting step further comprises the steps of:
   increasing a size of said active data fields; and
   decreasing a size of blank data fields comprised of data packets.

23. The method of claim 21 wherein said at least one threshold comprises a lower threshold of quality and in response to said lower threshold of quality not being met said adjusting step further comprises the steps of:
   decreasing a size of said active data fields; and
   increasing a size of blank data fields comprised of data packets.

24. The method of claim 21 wherein said at least one threshold comprises at least an upper threshold of quality and a lower threshold of quality and said adjusting step further comprises the steps of:
   increasing a size of said active data fields and decreasing a size of blank data fields comprised of data packets in response to said upper threshold of quality being exceeded; and
   decreasing a size of said active data fields and increasing a size of said blank data fields in response to said lower threshold of quality not being met.

25. The method of claim 24 wherein said adjusting step further comprises the step of:
   maintaining a size of said active data fields and said blank data fields in response to said upper threshold of quality not being met and said lower threshold of quality being exceeded.

26. The method of claim 21 wherein said blank data field is comprised of data having known values.

27. The method of claim 26 wherein said data with known values is discarded by a forward error correction decoder after decoding each of said codewords.

28. The method of claim 21 wherein said adjusting step is carried out by an RF data communications hub.

29. The method of claim 21 further comprising the step of:
   directing an RF data communications subscriber station to carry out said adjusting step.

30. The method of claim 21 wherein said counting step is carried out by an RF data transmission subscriber station, and comprises a count of at least one of a group consisting of:
   codeword errors;
   codeword errors destined for said subscriber station;
   packet discards; and
   payload discards for packets destined for said subscriber station.

31. The method of claim 30 further comprising the step of:
   sorting said count according to data stream.

32. The method of claim 30 further comprising the steps of:
   retaining a count by an RF data transmission hub of total number of codewords transmitted to said subscriber station, total number of packets sent to said subscriber station, and total data payload sent to said subscriber station, since a previous comparing step;
   sorting said count according to data stream; and
   transmitting said count of received data codewords and packets with errors to said hub.

33. The method of claim 21 wherein said counting step is carried out by an RF data transmission hub station, and comprises a count of at least one of a group consisting of:
   codeword errors for each data stream received by said hub;
   aggregate codeword errors received by said hub;
   packet discards for each of said data streams; and aggregate packet discards for packets received by said hub.

34. The method of claim 33 further comprising the step of:
sorting said count according to a subscriber station transmitting said data codewords and packets.

35. The method of claim 33 further comprising the step of:
sorting said count according to data stream.

36. The method of claim 33 further comprising the steps of:
retaining said results of said counting step as one of said previous counts; and
continuing said counting step.

37. An RF data transmission system employing adaptive forward error correction, said system comprising:
at least one RF data communications hub transmitting and receiving forward error correction encoded data codewords comprised of data packets; and
at least one RF data communications subscriber station transmitting and receiving forward error correction encoded data codewords comprised of data packets, wherein each of said subscriber stations count received data codewords and packets with errors uncorrectable by forward error correction from said hub and said subscriber station transmits said count to said hub;
wherein said hub calculates a type of quality measure using said count, compares said type of quality measure to predetermined upper and lower thresholds of quality, and said hub:
increases a size of active data fields of said codewords and decreases a size of blank data fields of said codewords, in response to said type of quality measure exceeding said upper threshold of quality; and
decreases a size of said active data fields and increases a size of said blank data fields, in response to said type of quality measure failing to meet said lower threshold of quality; and
wherein said hub counts received data codewords and packets with errors uncorrectable by forward error correction from each of said subscriber stations, calculates a type of quality measure from each of said subscriber stations using said count of errors from each of said subscriber stations, compares said type of quality measure from each of said subscriber stations to predetermined upper and lower thresholds of quality for that subscriber station, and said hub directs that subscriber station to:
increase a size of active data fields of said codewords and decrease a size of blank data fields of codewords transmitted from that subscriber station to said hub, in response to said type of quality measure exceeding said upper threshold of quality; and
decrease a size of said active data fields and increase a size of said blank data fields transmitted from that subscriber station to said hub, in response to said type of quality measure failing to meet said lower threshold of quality.

38. The system of claim 37 wherein said count of said data codewords and packets with errors uncorrectable by forward error correction received by said subscriber station are sorted by data stream.

39. The system of claim 37 wherein said count of said data codewords and packets with errors uncorrectable by forward error correction received by said hub are sorted by data stream.

40. The system of claim 37 wherein said calculation of type of quality measure is carried out for each data stream from each of said subscriber stations and said comparison of said type of quality measure to said thresholds is carried out for each data stream from each of said subscriber stations using thresholds for each of said data streams.

41. The system of claim 40 wherein said increases and decreases by said subscriber stations in said field sizes are directed by said hub for each data stream transmitted by each subscriber station.

42. The system of claim 37 wherein said blank data fields are comprised of data having known values.

43. The system of claim 42 wherein said data with known values is discarded by a forward error correction decoder after decoding said codewords.

44. The system of claim 37 wherein said hub maintains a size of said active data fields and said blank data fields in response to said upper thresholds of quality not being met and said lower thresholds of quality being exceeded.

45. The system of claim 37 wherein said received data codewords and packets with errors comprises at least one of a group consisting of:
codeword errors;
codeword errors destined for said subscriber station;
packet discards;
payload discards for packets destined for said subscriber station;
codeword errors for each data stream received by said hub;
aggregate codeword errors received by said hub;
packet discards for each of said data streams; and
aggregate packet discards for packets received by said hub.

46. The system of claim 45 wherein said subscriber station sorts said count according to data stream.

47. The system of claim 45 wherein said hub sorts said counts according to subscriber station transmitting, and data stream containing, said data codewords and packets.

48. The system of claim 45 wherein said hub maintains a count of total number of codewords for each data stream transmitted to said subscriber station, total number of packets for each data stream sent to said subscriber station, and total data payload sent to said subscriber station.

49. The system of claim 37 wherein a size of said data field is contained in header information associated with said codewords.

50. The system of claim 37 wherein said hub directs said subscriber via a data stream separate from data streams used for transmission of said data packets.

51. The system of claim 37 wherein said hub directs said subscriber stations via a control channel separate from channels used for transmission of said data packets.

* * * * *